United States Patent
Murakami et al.

(10) Patent No.: US 10,217,929 B2
(45) Date of Patent: Feb. 26, 2019

(54) PIEZOELECTRIC FILM, PIEZOELECTRIC ELEMENT, AND LIQUID DISCHARGE APPARATUS

(71) Applicant: FUJIFILM Corporation, Tokyo (JP)

(72) Inventors: Naoki Murakami, Kanagawa (JP); Takamichi Fujii, Kanagawa (JP); Takami Arakawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/968,522

(22) Filed: May 1, 2018

(65) Prior Publication Data

US 2018/0254406 A1 Sep. 6, 2018

Related U.S. Application Data

(63) Continuation of application No. PCT/JP2016/004874, filed on Nov. 14, 2016.

(30) Foreign Application Priority Data

Nov. 16, 2015 (JP) .................. 2015-223630
Jul. 13, 2016 (JP) .................. 2016-138143

(51) Int. Cl.
*H01L 41/187* (2006.01)
*B41J 2/14* (2006.01)
(Continued)

(52) U.S. Cl.
CPC .......... *H01L 41/1876* (2013.01); *B41J 2/14* (2013.01); *B41J 2/175* (2013.01); *H01L 41/09* (2013.01); *H01L 41/187* (2013.01)

(58) Field of Classification Search
CPC ... H01L 41/1876; H01L 41/187; H01L 41/09; B41J 2/175; B41J 2/14
See application file for complete search history.

(56) References Cited

U.S. PATENT DOCUMENTS 6,097,133 A * 8/2000 Shimada .............. B41J 2/14233
                                                      310/328
6,806,625 B2 * 10/2004 Ogawa ...................... B32B 18/00
                                                      310/358
(Continued)

FOREIGN PATENT DOCUMENTS

JP    2005-001926 A     1/2005
JP    2006-265651 A    10/2006
(Continued)

OTHER PUBLICATIONS

International Search Report issued in PCT/JP2016/004874; dated Mar. 7, 2017.
(Continued)

*Primary Examiner* — Yaovi M Ameh
(74) *Attorney, Agent, or Firm* — Studebaker & Brackett PC

(57) ABSTRACT

The piezoelectric film includes a perovskite oxide which is represented by General Formula P, $$A_{1+\delta}B_{1-x-y}Nb_xNi_yO_z \qquad \text{General Formula P}$$

where A contains at least Pb, B contains at least Zr and Ti, and x and y respectively satisfy $0.1 \leq x \leq 0.3$ and $0 \leq y \leq 0.75x$. Although standard values of $\delta$ and z are $\delta=0$ and $z=3$, these values may deviate from the standard values in a range in which a perovskite structure is capable of being obtained.

7 Claims, 5 Drawing Sheets

(51) Int. Cl.
*H01L 41/09* (2006.01)
*B41J 2/175* (2006.01)

(56) References Cited

U.S. PATENT DOCUMENTS

| | | |
|---|---|---|
| 2004/0021399 A1 | 2/2004 | Ogawa et al. |
| 2006/0158068 A1 | 7/2006 | Shimizu et al. |
| 2012/0112607 A1 | 5/2012 | Kim et al. |
| 2014/0004379 A1 | 1/2014 | Eguchi |
| 2014/0083971 A1 | 3/2014 | Fujii et al. |
| 2015/0132529 A1 | 5/2015 | Watanabe et al. |
| 2015/0255704 A1 | 9/2015 | Kim et al. |
| 2016/0005950 A1 | 1/2016 | Itayama et al. |

FOREIGN PATENT DOCUMENTS

| | | |
|---|---|---|
| JP | 2006-287254 A | 10/2006 |
| JP | 2012-099636 A | 5/2012 |
| JP | 2014-067808 A | 4/2014 |
| JP | 2015-170848 A | 9/2015 |
| JP | 2016-027651 A | 2/2016 |
| WO | 2012/124409 A1 | 9/2012 |

OTHER PUBLICATIONS

Written Opinion issued in PCT/JP2016/004874; dated Mar. 7, 2017.
International Preliminary Report on Patentability issued in PCT/JP2016/004874; completed Aug. 24, 2017.
Jungho Ryu et al.; "Effect of Heating Rate on the Sintering Behavior and the Piezoelectric Properties of Lead Zirconate Titanate Ceramics"; Journal of the American Ceramic Society; Apr. 2001; pp. 902-904; vol. 84, No. 4.
L. Bellaiche et al.; "Intrinsic Piezoelectric Response in Perovskite Alloys: PMN-PT versus PZT"; Physical Review Letters; Aug. 16, 1999; pp. 1347-1350, vol. 83, No. 7; The American Physical Society.
An Office Action mailed by the German Patent and Trademark Office dated Nov. 5, 2018, which corresponds to German Patent Application No. 11 2016 005 244.8 and is related to U.S. Appl. No. 15/968,522.
Takamichi Fujii et al., Characterization of Nb-doped Pb(Zr, Ti)O$_3$ films deposited on stainless steel and silicon substrates by RF-magnetron sputtering for MEMS applications, Sensors and Actuators A: Physical, 2010, pp. 220-225, A 163.

* cited by examiner

PIEZOELECTRIC FILM, PIEZOELECTRIC ELEMENT, AND LIQUID DISCHARGE APPARATUS

CROSS-REFERENCE TO RELATED APPLICATIONS

This application is a continuation application of International Application No. PCT/JP2016/004874 filed Nov. 14, 2016, which claims priority under 35 U.S.C. § 119(a) to Japanese Patent Application No. 2015-223630, filed Nov. 16, 2015, and Japanese Patent Application No. 2016-138143, filed Jul. 13, 2016. The above applications are hereby expressly incorporated by reference, in their entirety, into the present application.

BACKGROUND OF THE INVENTION

1. Field of the Invention

The present invention relates to a piezoelectric film containing lead zirconate titanate, a piezoelectric element using the piezoelectric film, and a liquid discharge apparatus.

2. Description of the Related Art

An actuator including an ink jet recording head is provided with a piezoelectric body having a piezoelectric property that expands and contracts with variation in applied electric field intensity, and a piezoelectric element provided with an electrode that applies an electric field to the piezoelectric body.

In recent years, in order to meet the demand for miniaturization of an apparatus, miniaturization of an actuator in cooperation with a semiconductor process technology such as a microelectromechanical systems (MEMS) technology has proceeded. In the semiconductor process technology, high-precision processing using film formation or photolithography becomes possible. Therefore, there has been actively conducted research on thinning of a piezoelectric body in an actuator.

As a piezoelectric material having high piezoelectric properties, a lead zirconate titanate (PZT)-based perovskite oxide has been widely used due to its performance. It is known that when a PZT-based perovskite oxide piezoelectric film has a morphotropic phase boundary (MPB) composition in which Zr:Ti is near 52:48, the piezoelectric constant and the electromechanical coupling coefficient thereof become maximum, which is appropriate for actuator applications.

In JP2012-99636A, it is described that in a piezoelectric element provided with a piezoelectric thin film having a laminate of a lead titanate layer and a lead zirconate layer, which have columnar structures, the compositions of lead titanate and lead zirconate in the piezoelectric thin film are caused to be MPB compositions, thereby improving piezoelectric properties.

On the other hand, as a technique for improving piezoelectric properties using a method other than that for the formation of the MPB compositions, doping a PZT-based piezoelectric film with various donor ions having higher valences than those of substituted ions is known. Since the ionic valence of Zr and Ti in B-site is 4, as donor ions that substitute for B-site elements, B-site elements having an ionic valence of 5 or higher, such as V, Nb, Ta, Sb, Mo, and W have been used. The amount of the donor ions that substitute for the B-site elements is very small. Specifically, in a case of Nb doping, the doping amount is about 0.2 to 0.025 mol % (refer to J. Am. Ceram. Soc, 84 (2001) 902 and Phys. Rev. Let, 83 (1999) 1347). This is because the crystallization temperature rises to 800° C. or higher in a case of doping with a large amount of Nb.

Here, WO2012/124409A discloses a ferroelectric thin film formed by depositing a dielectric material having a perovskite structure on a base body, in which the dielectric material is composed of a composite oxide in which metal materials other than Pb, Zr, and Ti as additives are mixed in PZT, the thin film has layers with different Zr/Ti ratios, a first layer having a small Zr mixing ratio is provided on the base body, and a second layer having a large Zr mixing ratio is provided on the first layer. In this configuration, the quality of crystallinity varies depending on the mixing concentration of the additives, and the crystallinity is improved in a case where the Zr mixing ratio is smaller than a predetermined ratio even in the dielectric material with varying piezoelectric properties, and good piezoelectric properties are exhibited in a case where the Zr mixing ratio increases to about the predetermined ratio. Therefore, the ferroelectric thin film which exhibits predetermined piezoelectric properties with a predetermined thickness can be formed with good crystallinity by combining the first layer having a mixing ratio for good crystallinity with the second layer having a mixing ratio for high piezoelectric properties. That is, a ferroelectric thin film which exhibits high piezoelectric properties is obtained by forming a thin film of the ferroelectric with good crystallinity on the base body in which a lower electrode layer is formed on a substrate. However, there is a need to form the first layer and the second layer on the base body using target materials with different Zr/Ti ratios in order to change the Zr mixing ratio, and thus the production is complex.

In JP2006-287254A, as a method of obtaining high piezoelectric properties and suppressing cracking during film formation, the amount of added metals doping PZT is specified by performing sputtering in an atmosphere without oxygen and thereafter performing a heat treatment process. However, in the method of JP2006-287254A, a heat treatment is necessary later, and it is difficult to control the amount of Pb because Pb evaporates at this time. Furthermore, the specified amount of added metals cannot cause further improved properties.

SUMMARY OF THE INVENTION

In recent years, with thinning of a piezoelectric film, a further improvement in piezoelectric properties is required. In addition, from the viewpoint of reducing power consumption, high piezoelectric properties are required even during low voltage driving. However, at a low voltage of generally 10 Vpp or lower, a region in which a polarization treatment is insufficient remains, and there is a problem that high properties cannot be obtained. In the technologies described in JP2012-99636A, WO2012/124409A, and JP2006-287254A, solutions to the improvement in piezoelectric performance during low voltage driving have not been provided yet.

The present invention has been made taking the foregoing circumstances into consideration, and an object thereof is to provide a piezoelectric film, a piezoelectric element, and a liquid discharge apparatus with high piezoelectric performance even during low voltage driving.

As a result of intensive study by the inventors, it was found that by co-doping the B-site of a PZT film with Nb and Ni and furthermore causing the amounts of Nb and Ni to be in a specific ratio, the piezoelectric performance during low voltage driving becomes very high.

That is, a piezoelectric film of the present invention is a piezoelectric film comprising: a perovskite oxide which is represented by General Formula P, $A_{1+\delta}B_{1-x-y}Nb_xNi_yO_z$          General Formula P where A contains at least Pb, B contains at least Zr and Ti, and x and y respectively satisfy $0.1 \leq x \leq 0.3$ and $0 < y \leq 0.75x$. Although standard values of $\delta$ and z are $\delta=0$ and $z=3$, these values may deviate from the standard values in a range in which a perovskite structure is capable of being obtained. In addition, impurities may be contained in a range in which the perovskite structure can be retained.

It is preferable that y satisfies $0.2x \leq y \leq 0.4x$.

It is preferable that x satisfies $0.2 \leq x \leq 0.3$.

It is preferable that the piezoelectric film is a columnar crystal film formed of a plurality of columnar crystals.

It is preferable that the piezoelectric film has a film thickness of 1 μm or greater.

A piezoelectric element of the present invention comprises: the piezoelectric film of the present invention; and an electrode which applies an electric field to the piezoelectric film.

It is preferable that a ratio of a piezoelectric constant $d31_{4Vpp}$ at a drive voltage of 4 Vpp and an offset voltage of $-2$ V to a piezoelectric constant $d31_{20Vpp}$ at a drive voltage of 20 Vpp and an offset voltage of $-10$ V satisfies $d31_{4Vpp}/d31_{20Vpp} \geq 0.8$.

A liquid discharge apparatus of the present invention comprises: the piezoelectric element of the present invention; and a liquid discharge member which is provided integrally with or separately from the piezoelectric element, in which the liquid discharge member has a liquid storage chamber which stores a liquid, and a liquid discharge port through which the liquid is discharged from the liquid storage chamber to the outside.

The piezoelectric film of the present invention is represented by $A_{1+\delta}B_{1-x-y}Nb_xNi_yO_z$ as General Formula P, A contains at least Pb, B contains at least Zr and Ti, and x and y respectively satisfy $0.1 \leq x \leq 0.3$ and $0 < y \leq 0.75x$, whereby high piezoelectric performance can be obtained even during low voltage driving.

DESCRIPTION OF THE PREFERRED EMBODIMENTS

Figure 1:
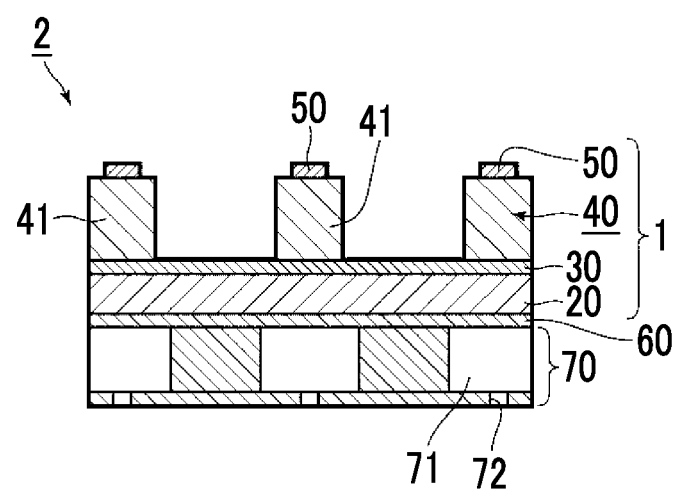
FIG. 1 is a schematic cross-sectional view illustrating an ink jet recording head, which is an example of a liquid discharge apparatus including a piezoelectric element of the present invention.

Hereinafter, a piezoelectric film, a piezoelectric element, and a liquid discharge apparatus of the present invention will be described with reference to the drawings.

[Piezoelectric Film] The piezoelectric film of the present invention is a piezoelectric film containing a perovskite oxide which is represented by General Formula P, $A_{1+\delta}B_{1-x-y}Nb_xNi_yO_z$          General Formula P where A contains at least Pb, B contains at least Zr and Ti, and x and y respectively satisfy $0.1 \leq x \leq 0.3$ and $0 < y \leq 0.75x$. Although standard values of $\delta$ and z are $\delta=0$ and $z=3$, these values may deviate from the standard values in a range in which a perovskite structure is capable of being obtained. In addition, impurities may be contained in a range in which the perovskite structure can be retained.

The piezoelectric film of the present invention is represented by General Formula P, and A (hereinafter, referred to as A-site) in General Formula P contains at least Pb. By adding donor ions that substitute for the A-site, the amount of Pb can be reduced, and thus the driving durability can be improved. Simultaneously with this, Pb deficiency can be compensated for, and the perovskite oxide film can be satisfactorily formed. Accordingly, the piezoelectric properties can be improved.

As element that can substitute for the A-site, at least one element selected from the group consisting of Ba, La, Sr, Bi, Li, Na, Ca, Mg, and K can be employed. The amount of the elements that substitute for the A-site is not particularly limited and can be added in a range in which the perovskite structure can be obtained.

In General Formula P representing the piezoelectric film of the present invention, B (hereinafter, referred to as B-site) contains at least Zr and Ti. It is said that in the PZT-based perovskite oxide, high piezoelectric performance is exhibited at morphotropic phase boundary (MPB) and in the vicinity thereof. In PZT, a rhombohedral phase is formed when rich in Zr, a tetragonal phase is formed when rich in Ti, and the boundary between the rhombohedral phase and the tetragonal phase, that is, MPB is formed in a case where the Zr/Ti molar ratio is near 55/45. Therefore, in General Formula P, the MPB composition or a composition close thereto is preferable. Specifically, Zr:Ti (molar ratio) is preferably 45:55 to 55:45.

In the piezoelectric film of the present invention, Nb is added to the B-site. It is known that a PZT film to which Nb is added (hereinafter, also referred to as PNZT) has a high piezoelectric constant. The PNZT film shows a good hysteresis loop, and the hysteresis loop is shifted to a positive voltage load side. Therefore, the polarization state initially has a direction. In a case where the amount of Nb increases, the piezoelectric performance can be improved. However, in a case where the amount of Nb is too large, a perovskite structure cannot be formed, and another phase with no piezoelectric properties, such as a pyrochlore phase, is generated, which is not preferable.

The proportion x of Nb in the B-site of the PNZT film of the present invention preferably satisfies $0.1 \leq x \leq 0.3$. By setting the amount of Nb to be in this range, the piezoelectric performance during low voltage driving can be improved. The proportion x of Nb more preferably satisfies $0.2 \leq x \leq 0.3$.

In the piezoelectric film of the present invention, the B-site is co-doped with Nb and Ni. The proportion y of Ni in the B-site preferably satisfies $0 < y \leq 0.75x$. By satisfying this range, the piezoelectric performance during low voltage driving can be improved. The proportion y of Ni more preferably satisfies $0.2x \leq y \leq 0.4x$.

As a result of intensive study by the inventors, it was found that by co-doping the B-site with Ni and causing the co-doping ratio of Nb and Ni to be in the above range, the piezoelectric constant during low voltage driving can be increased. It has been hitherto known that in a case where Nb is added to the B-site in a proportion of 30%, a pyrochlore phase is generated. However, it was found that by co-doping the B-site with Ni, no pyrochlore phase is generated even in a case where the amount of Nb added is 30%. Furthermore, it was surprisingly found that by co-doping the B-site with Ni, a PNZT film to which Nb is added in such an amount that a pyrochlore phase is not generated at first can also have improved piezoelectric properties.

Although details of the mechanism by which the above-described effect is obtained are unknown, it is assumed that by co-doping the B-site with Ni in a specific proportion, valences in the B-site are balanced and the polarization directions in crystals are easily aligned. Therefore, in a PNZT film hitherto known, it is known that the piezoelectric performance decreases due to the pyrochlore phase in a case where the amount of Nb added is about 30%, and in order to obtain a high piezoelectric constant, the upper limit is preferably 0.4 or less (40% in percentage). However, in a case of co-doping the PNZT film with Ni, a film to which Nb is added in an amount of up to 30% is examined in examples, which will be described later. However, it is assumed that the upper limit of the amount of Nb added is larger than 40%.

[Production Method of Piezoelectric Film]

The piezoelectric film of the present invention containing the perovskite oxide represented by General Formula P can be formed by a non-thermal-equilibrium process. As a suitable film formation method of the piezoelectric film of the present invention, a vapor phase growth method such as a sputtering method, a plasma chemical vapor deposition (CVD) method, a metalorganic chemical vapor deposition method (MOCVD method), a fire-quenching method, an anneal-quenching method, and a spray quenching method may be employed. Among these, the sputtering method is particularly preferable.

In a thermal equilibrium process such as a sol-gel method, doping with an additive having an inherently incompatible valence at a high concentration is difficult, and consideration of using a sintering aid or acceptor ions or the like is necessary. However, doping with donor ions at a high concentration can be achieved without consideration of a non-thermal-equilibrium process.

In the piezoelectric film of the present invention, a target in the sputtering method can be manufactured by employing the composition $A_{1+\delta}B_{1-x-y}Nb_xNi_yO_z$, where A contains at least Pb, B contains at least Zr and Ti, and x and y respectively satisfy $0.1 \leq x \leq 0.3$ and $0 < y \leq 0.75x$. That is, the piezoelectric film can be easily manufactured by adjusting the target composition for the amounts of Nb and Ni, and thus the film formation is not complex.

In addition, although δ is typically 0 as described above. However, since Pb is an element that is likely to be reversely sputtered and an escape of Pb from the formed piezoelectric film has an adverse effect on crystal growth, film formation is performed by setting the amount of Pb in the target to be greater than the stoichiometric composition of PZT. In this case, depending on the reverse sputtering rate of Pb, the formed film may become rich in Pb. As long as there is no hindrance to properties, there is no problem even in a case where Pb deficiency exists. However, by satisfying a range of $0 \leq \delta \leq 0.2$, a perovskite oxide film with good quality and no Pb deficiency can be formed.

In a case where a substrate temperature Ts during the film formation is 400° C. or lower, perovskite crystal growth becomes difficult, and in a case where the substrate temperature Ts is 750° C. or higher, a high temperature pyrochlore phase is likely to be incorporated. In order to obtain a columnar crystal film structure with good quality, Ts preferably satisfies $450 \leq Ts$ (° C.) $\leq 650$.

The sputtering method is preferable because the perovskite oxide film which is formed becomes a film having a columnar crystal film structure formed of a plurality of columnar crystals extending in nonparallel to the substrate surface. The growth direction of the columnar crystals may be nonparallel to the substrate surface and may be either a substantially perpendicular direction or an inclined direction. In this film structure, since an oriented film with aligned crystal orientations is obtained, higher piezoelectric performance can be obtained.

In addition, by using the sputtering method, the piezoelectric film doped with Nb and Ni at the above ratio can be formed into a film thickness of 1 μm or greater.

The average column diameter of a plurality of columnar crystals constituting the piezoelectric film is not particularly limited, and is preferably 30 nm or greater and 1 μm or lower. By causing the average column diameter of the columnar crystals to be in this range, favorable crystal growth can be achieved, and a piezoelectric film which can be patterned with high accuracy can be obtained. The average column diameter of the columnar crystals mentioned here means the average value of the column diameters of all the columnar crystals in a horizontal direction at any position in a film thickness direction.

[Piezoelectric Element and Ink Jet Recording Head]

An embodiment of the piezoelectric element of the present invention and an ink jet recording head, which is an example of a liquid discharge apparatus including the same, will be described with reference to FIG. 1. FIG. 1 is a schematic cross-sectional view of the ink jet recording head which is the example of the liquid discharge apparatus including the piezoelectric element.

As illustrated in FIG. 1, a piezoelectric element 1 of the embodiment is an element in which a lower electrode 30, a piezoelectric film 40, and an upper electrode 50 are sequentially laminated on a substrate 20, and an electric field is applied to the piezoelectric film 40 by the lower electrode 30 and the upper electrode 50 in the thickness direction. The piezoelectric film 40 is the piezoelectric film of the present invention.

The lower electrode 30 is formed on substantially the entire surface of the substrate 20, the piezoelectric film 40 having a pattern in which line-shaped protruding portions 41 extending from the front side to the rear side in the figure are arranged in a stripe shape is formed thereon, and the upper electrode 50 is formed on each of the protruding portions 41.

The pattern of the piezoelectric film 40 is not limited to the illustrated pattern and can be appropriately changed. In addition, the piezoelectric film 40 may also be a continuous film. However, by forming the piezoelectric film 40 in the pattern formed of the plurality of protruding portions 41 which are separated from each other instead of a continuous film, extension and contraction of the individual protruding portions 41 smoothly occur, and a greater displacement amount is obtained, which is preferable.

The substrate 20 is not particularly limited, and a substrate made of silicon, glass, stainless steel (SUS), yttrium-stabilized zirconia (YSZ), alumina, sapphire, or silicon carbide may be employed. As the substrate 20, a laminated substrate such as a SOI substrate in which a $SiO_2$ oxide film is formed on the surface of a silicon substrate may be used.

The primary components of the lower electrode 30 are not particularly limited, and metals or metal oxides such as Au, Pt, Ir, $IrO_2$, $RuO_2$, $LaNiO_3$, and $SrRuO_3$ and combinations thereof may be employed.

The primary components of the upper electrode 50 are not particularly limited, and the materials that exemplify the lower electrode 30, electrode materials generally used in a semiconductor process, such as Al, Ta, Cr, and Cu, and combinations thereof may be employed.

The thicknesses of the lower electrode 30 and the upper electrode 50 are not particularly limited, and for example, may be about 200 nm. The film thickness of the piezoelectric film 40 is not particularly limited, is typically 1 μm or greater, and is for example, 1 μm to 5 μm. The film thickness of the piezoelectric film 40 is preferably 3 μm or greater.

In the ink jet recording head (liquid discharge apparatus) 2, an ink nozzle (liquid storage and discharge member) 70 having ink chambers (liquid storage chambers) 71 that store ink and ink discharge ports (liquid discharge ports) 72 through which the ink is discharged from the ink chamber 71 to the outside is attached to substantially the lower surface of the substrate 20 of the piezoelectric element 1 having the above-described configuration via a diaphragm 60. A plurality of the ink chambers 71 are provided to correspond to the number and pattern of the protruding portions 41 of the piezoelectric film 40.

In the ink jet recording head 2, the intensity of an electric field applied to the protruding portions 41 of the piezoelectric element 1 is varied with the protruding portions 41 so as to cause the protruding portions 41 to extend and contract, such that the discharge and discharge amount of ink from the ink chambers 71 are controlled.

Instead of attaching the diaphragm 60 and the ink nozzle 70 which are members independent from the substrate 20, a portion of the substrate 20 may be processed into the diaphragm 60 and the ink nozzle 70. For example, in a case where the substrate 20 is formed as a laminated substrate such as a SOI substrate, the diaphragm 60 and the ink nozzle 70 may be formed by etching the rear surface side of the substrate 20 to form the ink chamber 71 and processing the substrate 20 itself.

The piezoelectric element 1 and the ink jet recording head 2 of the embodiment are configured as described above.

[Ink Jet Recording Device]

Figure 2:
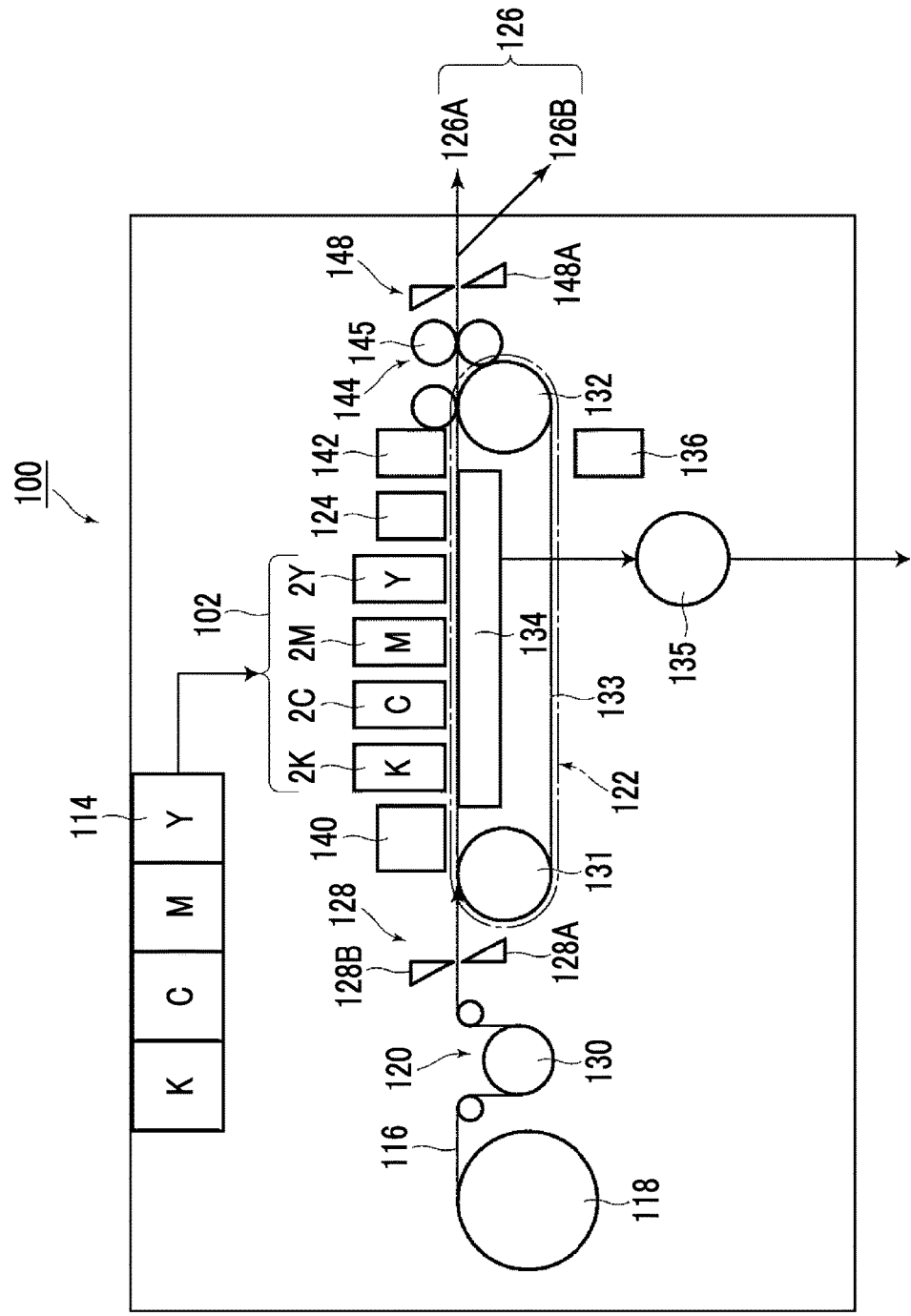
FIG. 2 is a schematic view of the configuration of an ink jet recording device provided with the ink jet recording head in FIG. 1.
Figure 3:
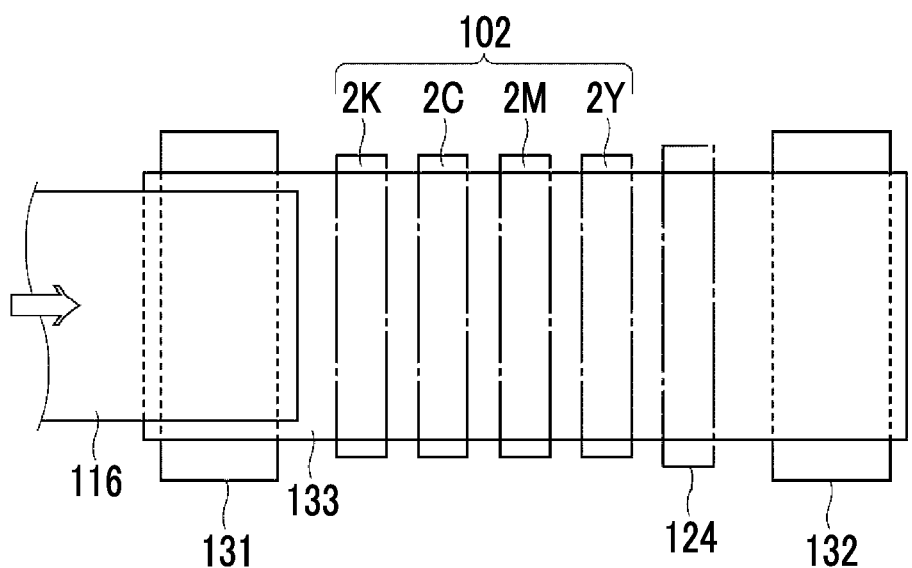
FIG. 3 is a partial top view of the ink jet recording device in FIG. 2.

An example of the configuration of an ink jet recording device provided with the ink jet recording head 2 of the embodiment will be described with reference to FIGS. 2 and 3. FIG. 2 is a schematic view of the configuration of the ink jet recording device. FIG. 3 illustrates a partial top view of the device. For ease of viewing, the scales of the constituent elements are different from actual scales.

As illustrated in FIG. 2, an ink jet recording device 100 is schematically constituted by a printing unit 102 having a plurality of ink jet recording heads (hereinafter, simply referred to as "heads") 2K, 2C, 2M, and 2Y respectively provided for ink colors, an ink storage/loading unit 114 which stores ink supplied to the heads 2K, 2C, 2M, and 2Y, a sheet feeding unit 118 which feds a recording sheet 116, a decurling unit 120 which eliminates curl of the recording sheet 116, an adsorption belt transporting unit 122 which is disposed to face a nozzle surface (ink discharge surface) of the printing unit 102 and transports the recording sheet 116 while holding the leveling of the recording sheet 116, a printing detection unit 124 which reads printing results of the printing unit 102, and a discharge unit 126 which discharges the printed recording sheet (printed matter) to the outside.

Each of the heads 2K, 2C, 2M, and 2Y constituting the printing unit 102 is the ink jet recording head 2 of the embodiment.

In the decurling unit 120, heat is applied to the recording sheet 116 by a heating drum 130 in a direction opposite to the curl direction, such that decurling is performed.

In an apparatus which uses a rolled sheet, as in FIG. 2, a cutter 128 for cutting is provided at the rear stage of the decurling unit 120, and the rolled sheet is cut into a desired size by the cutter. The cutter 128 is constituted by a fixed blade 128A having a length of equal to or greater than the transporting path width of the recording sheet 116, a round blade 128B which is moved along the fixed blade 128A, the fixed blade 128A is provided on the printing back surface side, and the round blade 128B is disposed on the printed surface side with the transporting path interposed therebetween. In an apparatus which uses a cut sheet, the cutter 128 is unnecessary.

The recording sheet 116 which is decurled and cut is sent to the adsorption belt transporting unit 122. The adsorption belt transporting unit 122 has a structure in which an endless belt 133 is wound between rollers 131 and 132 and is configured so that at least a portion which faces the nozzle surface of the printing unit 102 and a sensor surface of the printing detection unit 124 is a horizontal surface (flat surface).

The belt 133 has a width dimension wider than the width of the recording sheet 116, and a number of suction holes (not illustrated) are formed on the belt surface. On the inside of the belt 133 suspended between the rollers 131 and 132, at a position at which the belt 133 faces the nozzle surface of the printing unit 102 and the sensor surface of the printing detection unit 124, an adsorption chamber 134 is provided. By suctioning the adsorption chamber 134 using a fan 135 to achieve a negative pressure, the recording sheet 116 on the belt 133 is adsorbed and held.

As power of a motor (not illustrated) of at least one of the rollers 131 and 132 around which the belt 133 is wound is transmitted, the belt 133 is driven in a clockwise direction in FIG. 2, and the recording sheet 116 held on the belt 133 is transported from the left to the right in FIG. 2.

In a case where borderless printing is performed, ink is adhered onto the belt 133. Therefore, a belt cleaning unit 136 is provided at a predetermined position (an appropriate position excluding the printing region) on the outside of the belt 133.

On the upstream side of the printing unit 102 on the sheet transporting path formed by the adsorption belt transporting unit 122, a heating fan 140 is provided. The heating fan 140 heats the recording sheet 116 by blowing heating air toward the recording sheet 116 before being printed. Since the recording sheet 116 is heated immediately before printing, ink can be easily dried after being landed.

The printing unit 102 is a so-called full line type head in which line type heads having a length corresponding to the maximum sheet width is disposed in a direction perpendicular to the sheet feeding direction (main scanning direction) (see FIG. 3). Each of the printing heads 2K, 2C, 2M, and 2Y is configured as a line type head in which a plurality of ink discharge ports (nozzles) are arranged to have a length greater than at least one side of the recording sheet 116 with the maximum size, which is an object of the ink jet recording device 100.

The heads 2K, 2C, 2M, and 2Y respectively corresponding to color inks are disposed in order of black (K), cyan (C), magenta (M), and yellow (Y) from the upstream side in the feeding direction of the recording sheet 116. By discharging color ink from each of the heads 2K, 2C, 2M, and 2Y while transporting the recording sheet 116, a color image is recorded on the recording sheet 116.

The printing detection unit 124 is formed as a line sensor or the like which images droplet ejection results of the printing unit 102 and detects discharge failure such as clogging of a nozzle from an image of the ejected droplets, which is read by the line sensor.

At the rear stage of the printing detection unit 124, a post-drying unit 142 which is formed as a heating fan or the like, which dries the printed image surface. Since it is preferable to avoid contact with the printed surface until the ink is dried after the printing, a heated air blowing method is preferable.

At the rear stage of the post-drying unit 142, a heating and pressing unit 144 is provided to control the glossiness of the image surface. In the heating and pressing unit 144, the image surface is pressed by a pressing roller 145 having predetermined surface uneven shapes while the image surface is heated, such that the uneven shapes are transferred onto the image surface.

The printed matter obtained in this manner is discharged from the discharge unit 126. It is preferable that a target image to be originally printed (a print of a target image) and a test print are separately discharged. In the ink jet recording device 100, sorting means (not illustrated) for switching between sheet discharge paths to sorting the printed matter of the original image and the printed matter of the test print to be respectively sent to discharge units 126A and 126B is provided.

In a case where the original image and the test print are simultaneously printed in parallel on a large sheet, a configuration in which a cutter 148 formed of a fixed blade 148A and a round blade 148B is provided to cut and separate a portion of the test print may be employed.

The ink jet recording device 100 is configured as described above.

(Design Change)

The present invention is not limited to the above-described embodiment, and various changes in design can be made without departing from the gist of the present invention.

EXAMPLES

Hereinafter, examples of the present invention will be described.

(Production of Perovskite Oxide Dielectric (Piezoelectric Film))

As a film formation substrate, a substrate with an electrode, in which a 10 nm-thick Ti adhesion layer and a 300 nm-thick Ir lower electrode were sequentially laminated on a silicon on insulator (SOI) substrate in which a $SiO_2$ film is formed on a 25 mm square (100) silicon substrate, was prepared. In the substrate, for evaluation of a piezoelectric constant, a region capable of being evaluated by a cantilever was provided in advance.

The substrate with an electrode was placed in an RF sputtering apparatus, and under conditions with a degree of vacuum of 0.3 Pa and an $Ar/O_2$ mixed atmosphere ($O_2$ volume fraction 2.0%), by setting Zr/(Zr+Ti) in the target to 0.52, setting the amount of Nb doping the B-site to 10%, 20%, and 30%, and setting a substrate temperature to 450° C., film formation of a Nb-doped PZT piezoelectric film with a thickness of 3.0 μm was performed. In addition, the Ni doping amount was varied by using a target in which the amount of Ni in the piezoelectric film was changed.

Figure 4:
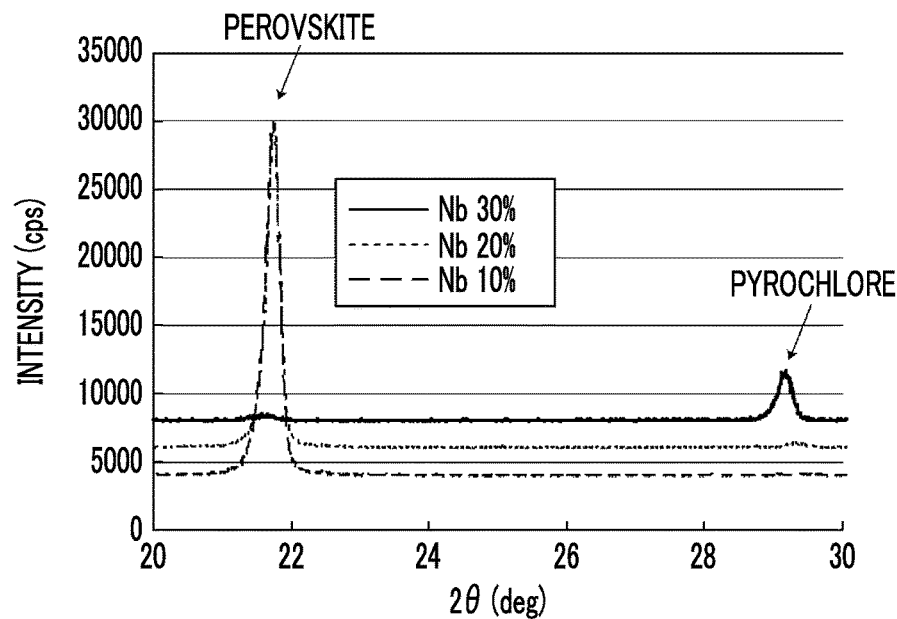
FIG. 4 is a diagram showing X-ray diffraction (XRD) spectra of PZT films having different Nb doping amounts.

As shown in FIG. 4, it can be seen by XRD measurement that pyrochlore crystals with no piezoelectric properties are primarily formed in a film in which the amount of Nb is larger than 30% in a case where Nb is singly used.

Figure 5:
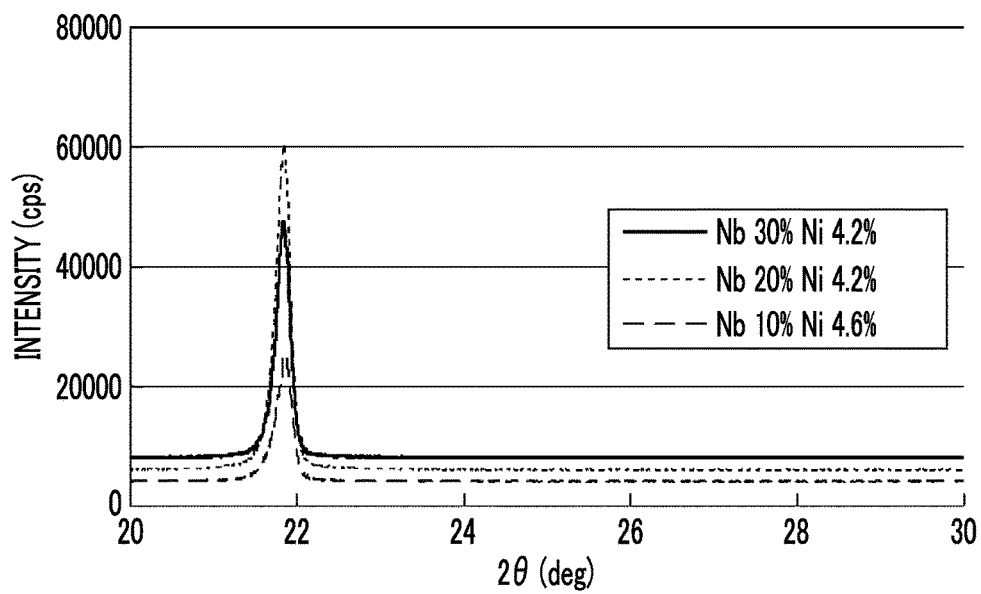
FIG. 5 is a diagram showing X-ray diffraction (XRD) spectra of PZT films doped with Nb and Ni in the present invention.

In the piezoelectric film of the present invention, as shown in FIG. 5, it can be seen that by doping the B-site with Ni, formation of pyrochlore crystals is suppressed, and perovskite crystals having piezoelectric properties are formed.

(Composition Evaluation and Measurement of Ni Doping Amount)

The amount of Ni in PZT was detected by X-ray fluorescence (XRF). In addition, in a case where the composition of the produced PZT film was evaluated by XRF, Pb satisfied a composition in the following range.

Pb/(Zr+Ti+Nb)=1.00 to 1.20

(Measurement of Displacement Amount and Calculation of Piezoelectric Constant)

A 100 nm-thick Pt upper electrode was formed on the Nb-doped PZT film, thereby producing a piezoelectric element. By processing a cantilever formation region into strip shapes each having a width of about 2 mm and a length of about 24 mm, cantilevers were produced. In addition, the longitudinal direction of the cantilever was caused to correspond to a (110) direction of crystals of a Si wafer, and the thickness direction thereof was caused to correspond to a (100) direction.

After the cantilever was fixed to cause the displaceable length of the cantilever to be about 18 mm, a sine wave drive voltage at a frequency of 1 kHz, 2 Vpp, and an offset voltage of −1 V was applied between the upper electrode and the lower electrode, and a displacement amount was obtained by measuring a tip end displacement amount in a case where the sine wave drive voltage was applied, using a laser doppler vibrometer. Vpp refers to the potential difference between the highest value and the lowest value of an AC voltage waveform.

First, using a finite element method, a resonant frequency was calculated by changing the length of the cantilever, and an effective length $L_0$ was determined by matching the resonant frequency to an actual measurement value. Next, the tip end displacement amount was calculated by setting the length $L_0$, a piezoelectric constant −d31 was obtained in a case where the tip end displacement amount was matched to an actual measurement value, and this was determined as the piezoelectric constant of a PZT-based thin film. A structure used in the finite element method was Pt (0.3 μm)·PZT/Ir (0.3 μm)/Si, and the following values were used as parameter values. In addition, since Si is an anisotropic material, a Young's modulus and a Poisson's ratio used in a simulation calculation need to correspond to the orientation of the cantilever longitudinal direction.

Si (110) orientation: Young's modulus $Y_{Si}$=169 GPa, Poisson's ratio $n_{Si}$=0.064

PZT: Young's modulus $Y_{PZT}$=50 GPa, Poisson's ratio $n_{PZT}$=0.34

Ir (lower electrode): Young's modulus $Y_{Ir}$=530 GPa, Poisson's ratio $n_{Ir}$=0.26

Pt (upper electrode): Young's modulus $Y_{Pt}$=168 GPa, Poisson's ratio $n_{Pt}$=0.39

Figure 6:
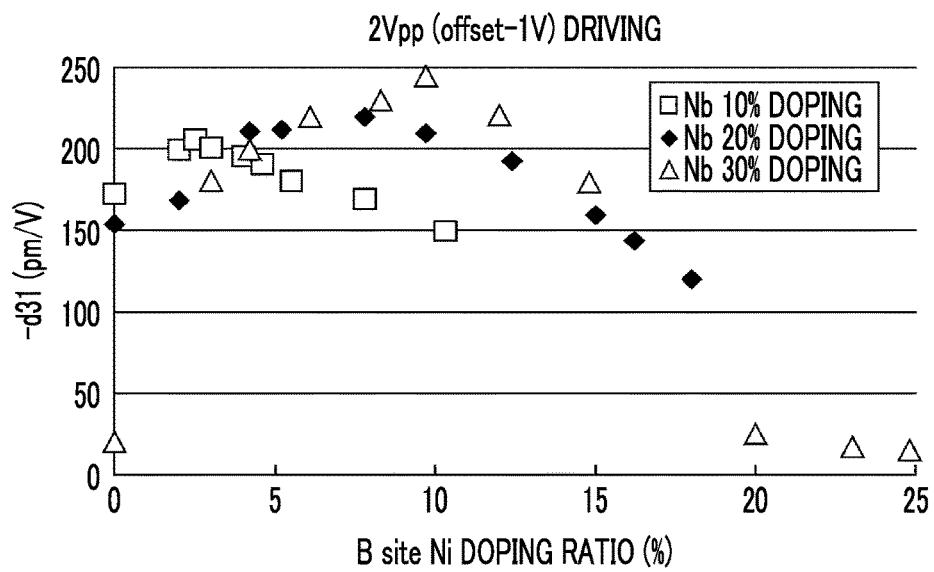
FIG. 6 is a diagram showing the relationship between a Ni doping amount and $-d31$.

FIG. 6 shows the relationship between the Ni doping amount and the piezoelectric constant −d31 during driving at an application voltage of 2 Vpp (an offset voltage of −1 V) in each of PZT films with Nb doping amounts of 10%, 20%, and 30%.

It can be seen from FIG. 6 that although doping with Ni improves the piezoelectric constant, no improvement in properties is confirmed in a case where the doping amount is too large. It is considered that this is because Nb is not incorporated into crystals in a case where the Ni amount becomes too large and Ni segregates, resulting in deterioration in properties.

In addition, it can be seen from FIG. 6 that an optimal Ni doping amount depends on the Nb doping amount. That is, as the Nb doping amount increases from 10% to 30%, the rate of increase in the piezoelectric constant due to the addition of Nb is larger compared to a case where Ni is not added at all. This was significant during low voltage driving particularly at 10 V or lower. Table 1 shows the data used in FIG. 6 as a table.

TABLE 1

| Nb doping amount (%) B-site ratio | Added element | Added element doping amount (%) B-site ratio | $-d31$ (pm/V) |
| --- | --- | --- | --- |
| Comparative Example | 10 | None | 0 | 173 |
| Example | 10 | Ni | 2 | 200 |
| Example | 10 | Ni | 2.5 | 206 |
| Example | 10 | Ni | 3 | 201 |
| Example | 10 | Ni | 4 | 196 |
| Example | 10 | Ni | 4.6 | 191 |
| Example | 10 | Ni | 5.5 | 181 |
| Comparative Example | 10 | Ni | 7.8 | 170 |
| Comparative Example | 10 | Ni | 10.3 | 150 |
| Comparative Example | 20 | None | 0 | 154 |
| Example | 20 | Ni | 2 | 169 |
| Example | 20 | Ni | 4.2 | 211 |
| Example | 20 | Ni | 5.2 | 212 |
| Example | 20 | Ni | 7.8 | 220 |
| Example | 20 | Ni | 9.7 | 210 |
| Example | 20 | Ni | 12.4 | 193 |
| Example | 20 | Ni | 15 | 160 |
| Comparative Example | 20 | Ni | 16.2 | 144 |
| Comparative Example | 20 | Ni | 18 | 120 |
| Comparative Example | 30 | None | 0 | 21 |
| Example | 30 | Ni | 3 | 181 |
| Example | 30 | Ni | 4.2 | 200 |
| Example | 30 | Ni | 6.1 | 220 |
| Example | 30 | Ni | 8.3 | 230 |
| Example | 30 | Ni | 9.7 | 245 |
| Example | 30 | Ni | 12 | 221 |
| Example | 30 | Ni | 14.8 | 180 |
| Example | 30 | Ni | 20 | 26 |
| Comparative Example | 30 | Ni | 23 | 18 |
| Comparative Example | 30 | Ni | 24.8 | 16 |

Figure 7:
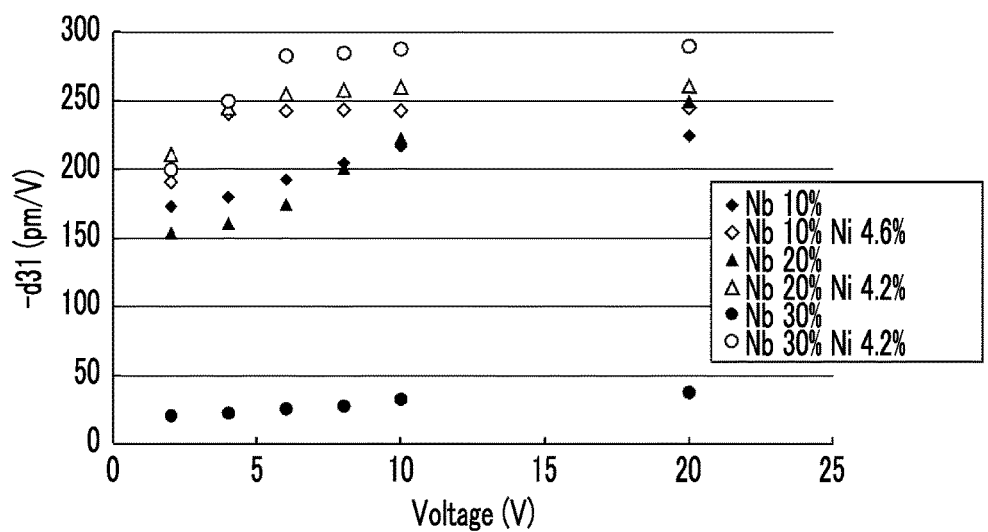
FIG. 7 is a diagram showing the relationship between a drive voltage and $-d31$.

FIG. 7 shows the relationship between the application voltage (Vpp, an offset voltage of −Vpp/2) and the piezoelectric constant −d31 in each of PZT films to which Ni is added in amounts of 4.6%, 4.2%, and 4.2% in a case where the Nb doping amount is 10%, 20%, and 30%.

It can be seen that the properties at a low voltage are greatly improved by doping with Ni. By doping with Ni, the polarization directions of crystals in the film are aligned, and thus a polarization treatment becomes unnecessary. Therefore, it is considered that even in a film that is not subjected to the polarization treatment, high piezoelectric performance can be obtained during low voltage driving.

It can be seen from FIG. 7 that the ratio of a piezoelectric constant $d31_{4Vpp}$ at a drive voltage of 4 Vpp and an offset voltage of $-2$ V to a piezoelectric constant $d31_{20Vpp}$ at a drive voltage of 20 Vpp and an offset voltage of $-10$ V satisfies $$d31_{4Vpp}/d31_{20Vpp} \geq 0.8.$$

This indicates that the polarization directions are aligned during low voltage driving and thus the polarization treatment is unnecessary. Table 2 shows the data used in FIG. 7 as a table.

TABLE 2

| | Target contents | | | | |
| --- | --- | --- | --- | --- | --- |
| | Nb doping amount (%) B-site ratio | Added element | Added element doping amount (%) B-site ratio | Application voltage (Vpp, offset voltage $-Vpp/2$) | $-d31$ (pm/V) |
| Comparative Example | 10 | None | 0 | 2 | 173 |
| | | | | 4 | 180 |
| | | | | 6 | 193 |
| | | | | 8 | 205 |
| | | | | 10 | 217 |
| | | | | 20 | 225 |
| Example | | Ni | 4.6 | 2 | 191 |
| | | | | 4 | 241 |
| | | | | 6 | 243 |
| | | | | 8 | 244 |
| | | | | 10 | 243 |
| | | | | 20 | 245 |
| Comparative Example | 20 | None | 0 | 2 | 154 |
| | | | | 4 | 161 |
| | | | | 6 | 175 |
| | | | | 8 | 201 |
| | | | | 10 | 223 |
| | | | | 20 | 250 |
| Example | | Ni | 4.2 | 2 | 211 |
| | | | | 4 | 245 |
| | | | | 6 | 255 |
| | | | | 8 | 258 |
| | | | | 10 | 260 |
| | | | | 20 | 261 |
| Comparative Example | 30 | None | 0 | 2 | 21 |
| | | | | 4 | 23 |
| | | | | 6 | 26 |
| | | | | 8 | 28 |
| | | | | 10 | 33 |
| | | | | 20 | 38 |
| Example | | Ni | 4.2 | 2 | 200 |
| | | | | 4 | 250 |
| | | | | 6 | 283 |
| | | | | 8 | 285 |
| | | | | 10 | 288 |
| | | | | 20 | 290 |

The piezoelectric film of the present invention can be preferably used in an ink jet recording head, a magnetic recording and reproducing head, a microelectromechanical systems (MEMS) device, a micropump, a piezoelectric actuator mounted in an ultrasound probe, and a ferroelectric element such as a ferroelectric memory.

EXPLANATION OF REFERENCES

1: piezoelectric element
2, 2K, 2C, 2M, 2Y: ink jet recording head (liquid discharge apparatus)
20: substrate
30, 50: electrode
40: piezoelectric film
70: ink nozzle (liquid storage and discharge member)
71: ink chamber (liquid storage chamber)
72: ink discharge port (liquid discharge port)
100: ink jet recording device

What is claimed is:

1. A piezoelectric film comprising:
a perovskite oxide which is represented by General Formula P, $$A_{1+\delta}B_{1-x-y}Nb_xNi_yO_z \qquad \text{General Formula P}$$

where A contains at least Pb, B contains at least Zr and Ti, and x and y respectively satisfy $0.1 \leq x \leq 0.3$ and $0.2x \leq y \leq 0.4x$, wherein, although standard values of $\delta$ and z are $\delta=0$ and $z=3$, these values may deviate from the standard values in a range in which a perovskite structure is capable of being obtained.

2. The piezoelectric film according to claim 1, wherein x satisfies $0.2 \leq x \leq 0.3$.

3. The piezoelectric film according to claim 1, wherein the piezoelectric film is a columnar crystal film formed of a plurality of columnar crystals.

4. The piezoelectric film according to claim 1, wherein the piezoelectric film has a film thickness of 1 μm or greater.

5. A piezoelectric element comprising:
the piezoelectric film according to claim 1; and
an electrode which applies an electric field to the piezoelectric film.

6. The piezoelectric element according to claim 5,
wherein a ratio of a piezoelectric constant $d31_{4V_{pp}}$ at a drive voltage of 4 Vpp and an offset voltage of −2 V to a piezoelectric constant $d31_{20V_{pp}}$ at a drive voltage of 20 Vpp and an offset voltage of −10 V satisfies $$d31_{4V_{pp}}/d31_{20V_{pp}} \geq 0.8.$$

7. A liquid discharge apparatus comprising:
the piezoelectric element according to claim 5; and
a liquid discharge member which is provided integrally with or separately from the piezoelectric element,
wherein the liquid discharge member has a liquid storage chamber which stores a liquid, and a liquid discharge port through which the liquid is discharged from the liquid storage chamber to the outside.

* * * * *